United States Patent
Sugawara

(10) Patent No.: US 8,004,065 B2
(45) Date of Patent: Aug. 23, 2011

(54) NITRIDE SEMICONDUCTOR AND METHOD FOR MANUFACTURING SAME

(75) Inventor: Hideto Sugawara, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 219 days.

(21) Appl. No.: 12/250,767

(22) Filed: Oct. 14, 2008

(65) Prior Publication Data

US 2009/0101935 A1    Apr. 23, 2009

(30) Foreign Application Priority Data

Oct. 17, 2007   (JP) .................................. 2007-270371

(51) Int. Cl.
*H01L 33/00*    (2010.01)
*H01L 21/20*    (2006.01)
(52) U.S. Cl. ................ 257/615; 257/103; 257/E33.025; 257/E21.085; 438/483
(58) Field of Classification Search .................. 257/615, 257/103; 428/697
See application file for complete search history.

(56) References Cited

U.S. PATENT DOCUMENTS

2006/0209395 A1*  9/2006  Sasaoka .................... 359/344
2006/0257626 A1*  11/2006  Schlesser et al. .......... 428/141

FOREIGN PATENT DOCUMENTS

JP    2003-077841    3/2003
JP    2007-157765    6/2007

OTHER PUBLICATIONS

Motoki, et al, Dislocation reduction in GaN crystal by advanced-DEEP, Journal of Crystal Growth 305 (2007) 377-383.

* cited by examiner

*Primary Examiner* — Jarrett J Stark
*Assistant Examiner* — Lawrence Tynes, Jr.
(74) *Attorney, Agent, or Firm* — Turocy & Watson, LLP

(57) ABSTRACT

A nitride semiconductor includes: a substrate having a major surface including a first crystal polarity surface and a second crystal polarity surface different from the first crystal polarity surface; and a single polarity layer provided above the major surface and having a single crystal polarity.

15 Claims, 3 Drawing Sheets

NITRIDE SEMICONDUCTOR AND METHOD FOR MANUFACTURING SAME

CROSS-REFERENCE TO RELATED APPLICATIONS

This application is based upon and claims the benefit of priority from the prior Japanese Patent Application No. 2007-270371, filed on Oct. 17, 2007; the entire contents of which are incorporated herein by reference.

BACKGROUND OF THE INVENTION

1. Field of the Invention

This invention relates to a nitride semiconductor and a method for manufacturing the same.

2. Background Art

Nitride semiconductors including GaN find wide application in light emitting diodes for display and illumination, semiconductor lasers for the next generation DVD (digital versatile disk), and electronic devices.

The nitride semiconductor crystal has a hexagonal wurtzite structure, which has no symmetry along the c-axis. Hence, an epitaxial film grown on the c-surface has front-rear polarity, that is, a group III surface and a group V surface. The surface of a GaN single crystal substrate may have nonuniformity in crystal polarity and surface orientation. Use of such a substrate is likely to cause within-wafer variation in crystal growth rate and impurity doping.

JP-A-2007-157765(Kokai) discloses a technique related to a gallium nitride semiconductor light emitting device with the crystal growth surface being a nitrogen-polar surface. In this technique, the direction of electric field at the p-side GaN/AlGaN interface is reversed to attract holes toward the light emitting region, thereby avoiding carrier depletion at the interface.

However, this technique is not sufficient to control crystal polarity in the wafer surface.

SUMMARY OF THE INVENTION

According to an aspect of the invention, there is provided a nitride semiconductor including: a substrate having a major surface including a first crystal polarity surface and a second crystal polarity surface different from the first crystal polarity surface; and a single polarity layer provided above the major surface and having a single crystal polarity.

Moreover, according to another aspect of the invention, there is provided a method for manufacturing a nitride semiconductor, including: forming a selective growth mask on a first crystal polarity surface constituting part of a major surface of a substrate; performing selective crystal growth of a polarity inversion layer on a second crystal polarity surface constituting the major surface with the first crystal polarity surface so that the polarity inversion layer has a surface having the same crystal polarity as the first crystal polarity surface; removing the selective growth mask; and performing crystal growth of a single polarity layer on the first crystal polarity surface and the surface of the polarity inversion layer.

Moreover, according to still another aspect of the invention, there is provided a method for manufacturing a nitride semiconductor, including: forming a selective growth mask on a first crystal polarity surface constituting part of a major surface of a substrate and on a prescribed region of a second crystal polarity surface constituting the major surface with the first crystal polarity surface; performing selective crystal growth of a polarity inversion layer on a region of the second crystal polarity surface outside the prescribed region, the polarity inversion layer having a smaller thickness than the selective growth mask, so that the polarity inversion layer has a surface having the same crystal polarity as the first crystal polarity surface; removing the selective growth mask formed on the first crystal polarity surface; and performing crystal growth of a single polarity layer on the first crystal polarity surface, the selective growth mask formed on the prescribed region, and the surface of the polarity inversion layer, on the selective growth mask, the single polarity layer being crystal grown by lateral growth.

DETAILED DESCRIPTION OF THE INVENTION

Figure 1A:
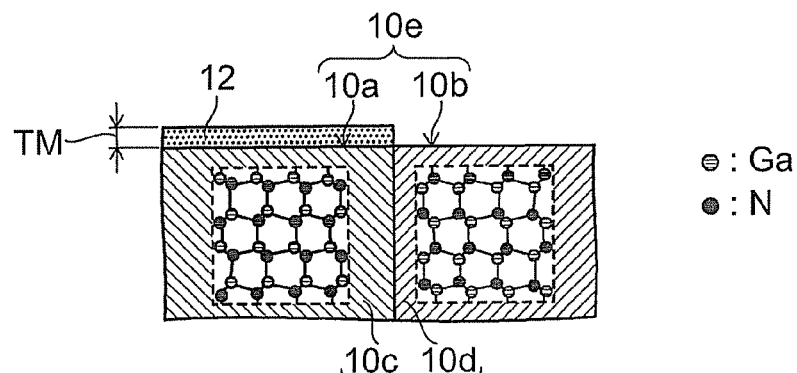
FIGS. 1A to 1D are process cross-sectional views of a method for manufacturing a nitride semiconductor according to an embodiment of the invention.
Figure 1B:
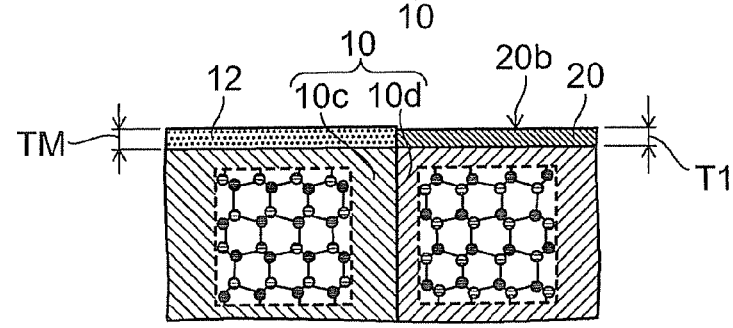

Embodiments of the invention will now be described with reference to the drawings.

FIG. 1 is a process cross-sectional view illustrating a method for manufacturing a nitride semiconductor according to an embodiment of the invention. More specifically, FIG. 1A is a schematic cross-sectional view in which a selective growth mask is formed, FIG. 1B is a schematic cross-sectional view in which a polarity inversion layer is formed, FIG. 1C is a schematic cross-sectional view in which the selective growth mask is removed, and FIG. 1D is a schematic cross-sectional view of the nitride semiconductor according to the first embodiment after completion of the process in which a single polarity layer is formed.

The term "nitride semiconductor" used herein refers to semiconductors expressed as $(Al_xB_{1-x})_yGa_zIn_{1-y-z}N$ ($0 \leq x \leq 1$, $0 \leq y \leq 1$, $0 \leq z \leq 1$, $y+z \leq 1$). Furthermore, the "nitride semiconductor" also includes those further containing any group V element such as As and P, and those containing p-type or n-type impurities.

The substrate 10 made of GaN has a hexagonal wurtzite structure. Hence, for example, a first polarity layer 10c with the growth surface being a gallium-polar (Ga-polar) surface 10a may be adjacent to a second polarity layer 10d with the growth surface being a nitrogen-polar (N-polar) surface 10b, and they constitute a major surface 10e, which is a generally flat common surface. The structure of the first polarity layer 10c and the second polarity layer 10d is each schematically shown in the dashed line. In crystal growth of GaN, typically, anions (N) and cations (Ga) are alternately arrayed.

Alternatively, a sapphire substrate can also be used for crystal growth thereon. However, homoepitaxial growth on a GaN substrate is more preferable because it can reduce crystal defects more easily and improve device characteristics.

In FIG. 1A, a selective growth mask 12 is patterned on the Ga-polar surface 10a, which is a (0001) surface. The selective growth mask 12 is illustratively made of an insulating material (e.g., $SiO_2$) on the surface of which nitride semiconductors are not likely to grow in the crystal growth process.

On the N-polar surface 10b, which is a (000-1) surface with no selective growth mask 12 formed thereon, crystal growth of a nitride semiconductor to serve as a polarity inversion layer 20 is selectively performed by MOCVD (metal organic chemical vapor deposition), for example. In this embodiment, Mg-doped GaN is illustratively grown as the polarity inversion layer 20.

This selective crystal growth process based on MOCVD is described in the following steps (1) to (4).

(1) The substrate 10 of FIG. 1A is mounted on a susceptor in an MOCVD reaction chamber, and its temperature is increased in a mixed atmosphere of nitrogen and ammonia gas. The preset temperature is preferably lower than the temperature for crystal growth of the substrate 10, and illustratively 1000° C. or less.

(2) A Ga raw material (e.g., TMG) and a Mg raw material (e.g., Cp2Mg) are supplied. Here, TMG (trimethylgallium) and Cp2Mg (bis(cyclopentadienyl)magnesium) are thermally decomposed into the Ga raw material and the Mg raw material.

(3) The supply of the Ga and Mg raw material is stopped when the thickness T1 of the crystal growth layer is in the range of 100 nm or less, and more preferably 50 nm or less.

(4) The temperature is decreased in a mixed atmosphere of nitrogen and ammonia gas.

Figure 1C:
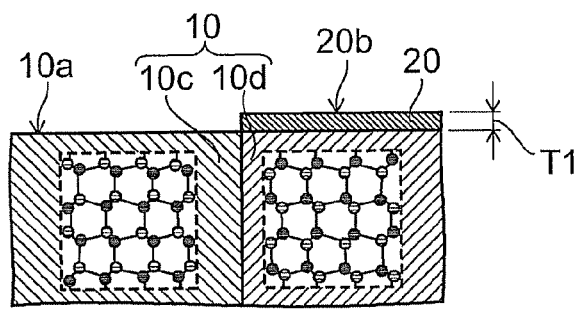

Here, the Mg concentration in GaN is made higher than $1 \times 10^{20}$ cm$^{-3}$. According to experiments by the inventor, it was found that in the Mg-doped GaN thus formed, the N-polar surface of the underlying crystal can be inverted and turned into a Ga-polar surface. Thus, if the selective growth mask 12 is removed as shown in FIG. 1C, the surface 10a of the first crystal polarity layer 10c and the surface 20b of the Mg-doped GaN (thickness T1), that is, the polarity inversion layer 20, are both Ga-polar surfaces.

Figure 1D:
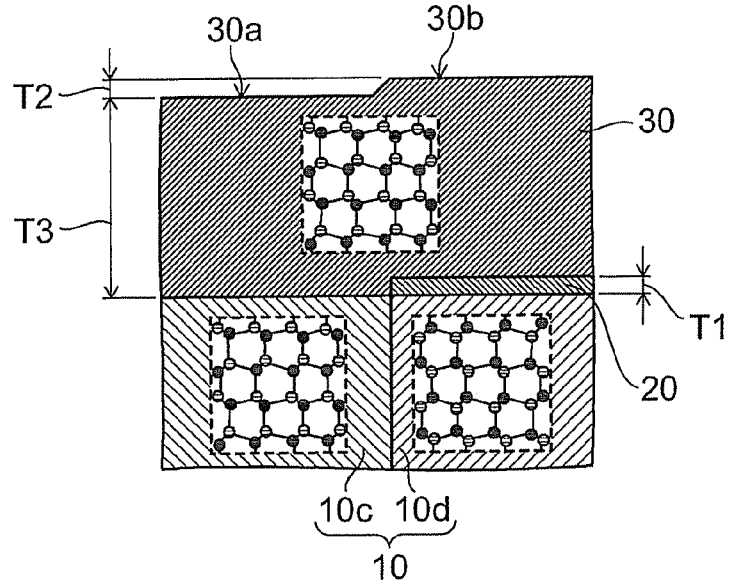

In the state in which the major surface 10e is turned into a single Ga-polar surface, a single polarity layer 30 made of a nitride semiconductor having a thickness of generally T3 is entirely crystal grown by MOCVD. The cross section thereof is as shown in FIG. 1D. The step difference T2 between the surface 30a of the single polarity layer 30 above the Ga-polar surface 10a and the surface 30b of the single polarity layer 30 above the N-polar surface 10b is 100 nm or less. The crystal growth temperature of the single polarity layer 30 is preferably made higher than the crystal growth temperature of the polarity inversion layer 20 in step (1) of the selective crystal growth process to reduce crystal defects.

In the case of a light emitting device, the single polarity layer 30 includes at least a p-type semiconductor layer, an n-type semiconductor layer, and a light emitting layer, and typically has a thickness T3 of 1 μm or more. Hence, the step difference of 100 nm or less is sufficiently small. If the step difference T2 is 100 nm or less, the surface can be treated as a generally flat surface in the device manufacturing process. The step difference T2 can be further reduced by the embedding effect. It is noted that the surface 20b of the polarity inversion layer 20 is a Ga-polar surface, which may make it difficult to clearly identify the boundary between the polarity inversion layer 20 and the single polarity layer 30 as shown in FIG. 1D.

In the Mg-doped GaN crystal growth, which is step (1) of the selective crystal growth process, at least the Mg concentration is made higher than $1 \times 10^{20}$ cm$^{-3}$ to destabilize the arrangement of growth species including N, Ga, and Mg so that the same atoms are joined or adjacent to each other, triggering polarity inversion. Furthermore, the crystal growth temperature of MOCVD set to 1000° C. or less facilitates maintaining the unstable state and further ensures polarity inversion. As the crystal growth method, MBE (molecular beam epitaxy) can also be used.

Figure 2A:
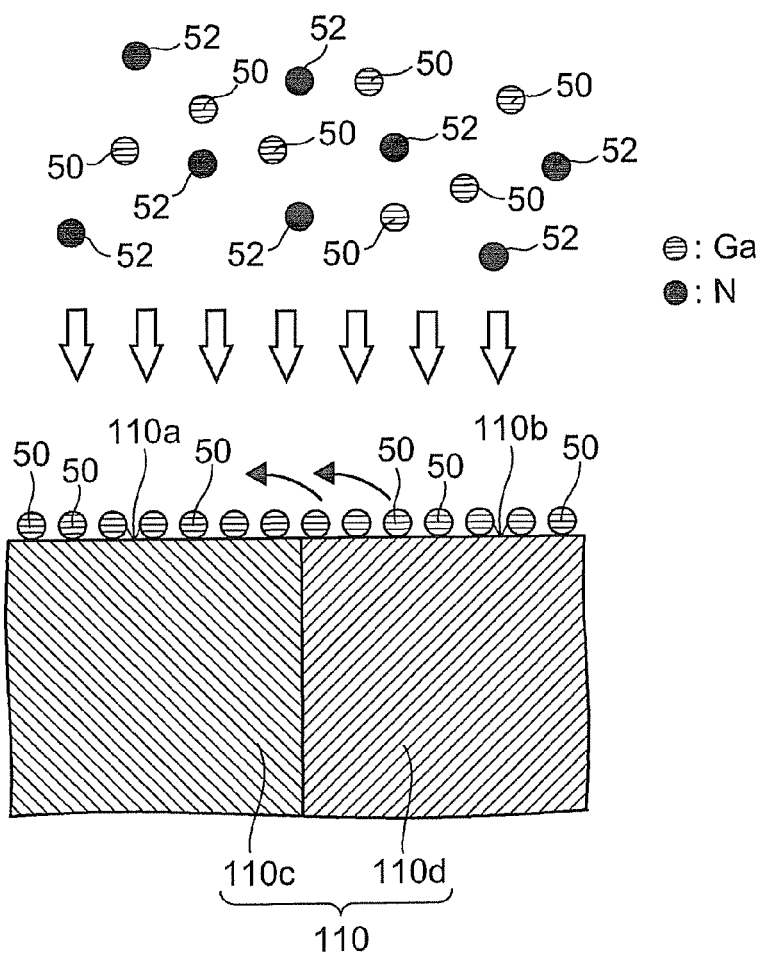
FIGS. 2A and 2B are schematic views of a nitride semiconductor based on a mixed polar substrate according to a comparative example.
Figure 2B:
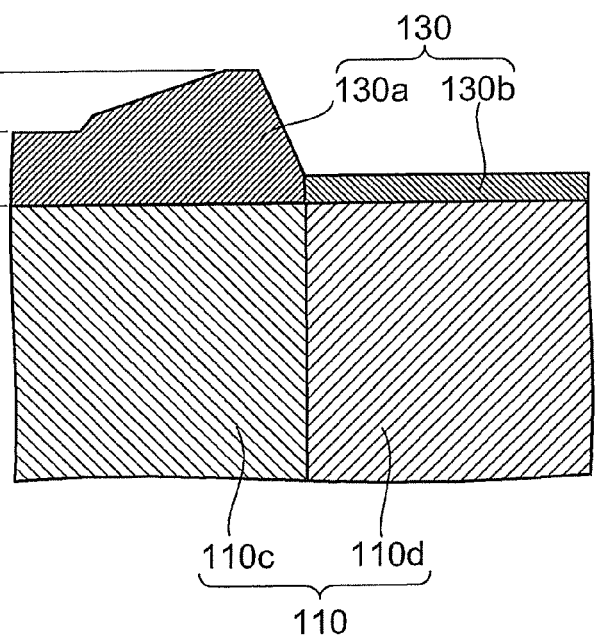

FIG. 2 is a schematic view illustrating a nitride semiconductor based on a mixed polar substrate according to a comparative example, in which FIG. 2A schematically shows crystal growth, and FIG. 2B is a schematic cross-sectional view after the crystal growth. In FIG. 2A, Ga particles 50, for example, are uniformly supplied to the surface of a substrate 110 with mixed polar crystal surfaces 110a, 110b. The growth rate on the N-polar surface 110b is lower than the growth rate on the Ga-polar surface 110a because the rate of trapping Ga particles is lower.

In the comparative example, crystal layers 130 each inheriting the crystal polarity of the surface of the substrate 110 are formed. More specifically, the growth rates of the crystal polarity layers 110c and 110d are different from each other, and hence a step difference is likely to occur at the surface. Furthermore, the difference in capture rate between the Ga particle 50 and the N particle 52 serving as impurity raw materials produces nonuniformity in impurity doping, causing in-plane variation in electrical characteristics.

Furthermore, because of the difference in growth rate, the Ga particle 50 is diffused at a higher rate from the N-polar surface 110b toward the Ga-polar surface 110a as shown by the arrow. This increases the raw material concentration on the Ga-polar surface 110a near the boundary between the two polar surfaces 110a, 110b and produces a growth protrusion with height T140 as in FIG. 2B. The protrusion can be reduced by varying the MOCVD growth conditions such as pressure, temperature, and gas concentration, but the reduction is limited.

According to experiments by the inventor, in the case where the thickness T130 of the flat region on the Ga-polar surface 110a is generally 5 μm, it was difficult to decrease the protrusion height T140 to less than 1 μm, and in the case where the thickness T130 of the flat region is 1 μm, it was difficult to decrease the protrusion height T140 to less than 0.2 μm. Such a large step difference T140 at the surface makes it difficult to produce a flat or uniform photoresist and oxide film in the device manufacturing process, and it is difficult to reliably form microstructures.

In this embodiment, a polarity inversion layer 20 is formed on one crystal polarity surface 10b to match its crystal polarity with the other crystal polarity surface 10a. Thus, a single polarity layer 30 can be formed, and the growth rate and the amount of impurity doping can be generally equalized. Hence, the surface step difference T2 can be reduced. This can facilitate the manufacturing process and achieve more uniform device characteristics in the wafer surface, improving the device yield. Furthermore, for example, the characteristics and yield of LED according to this embodiment can be generally comparable to the characteristics and yield of LED based on a substrate free from mixed crystal polarity.

In general, the melting point of GaN and the equilibrium vapor pressure of nitrogen are extremely high. Hence, it is difficult to grow a GaN bulk crystal from melt. Thus, the manufacturing process for a GaN substrate is complicated and increases cost. In contrast, this embodiment can reduce the ineffective region of the wafer, hence facilitating device cost reduction.

FIG. 3 is a process cross-sectional view illustrating another method for manufacturing a nitride semiconductor according to an embodiment of the invention. More specifically, FIG. 3A is a schematic cross-sectional view in which a selective growth mask is formed, FIG. 3B is a schematic cross-sectional view in which a polarity inversion layer is formed, FIG. 3C is a schematic cross-sectional view in which the selective growth mask is removed, and FIG. 3D is a schematic cross-sectional view of the nitride semiconductor according to the second embodiment after completion of the process in which a single polarity layer is formed.

Figure 3A:
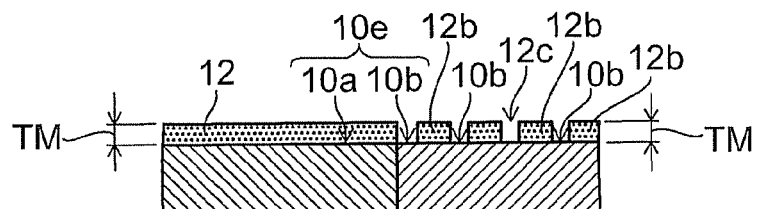
FIGS. 3A to 3D are process cross-sectional views of another method for manufacturing a nitride semiconductor.

In this embodiment, as in FIG. 3A, the selective growth mask 12b is left also on a prescribed region of the N-polar surface 10b. That is, the selective growth mask 12b has an opening 12c outside the prescribed region. On the N-polar surface 10b, the ratio of the area of the opening 12c to the area of the N-polar surface 10b is 50% or less. Furthermore, the thickness TM of the selective growth mask 12, 12b is illustratively 100 nm.

Figure 3B:
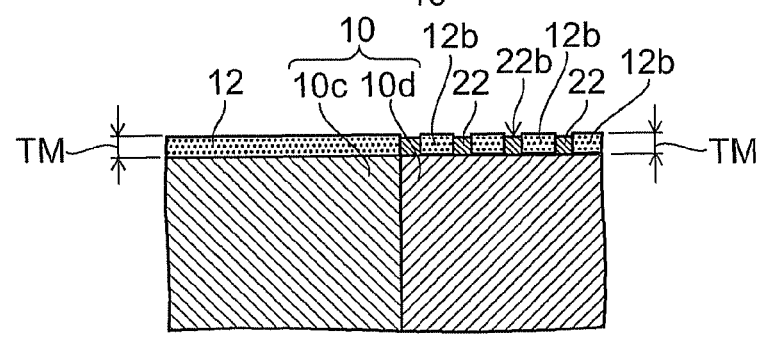
Figure 3C:
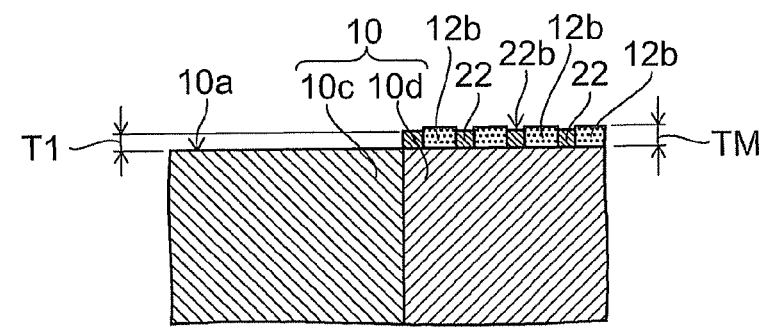

As in FIG. 3B, a polarity inversion layer 22 is formed by MOCVD so that its thickness T1 is illustratively 100 nm or less, and more preferably 50 nm or less. The selective crystal growth process described above is used so that the surface 22b of the polarity inversion layer 22 is turned into a Ga-polar surface. Subsequently, as in FIG. 3C, the selective growth mask 12 on the Ga-polar surface 10a is removed with the selective growth mask 12b left on the N-polar surface 10b. Furthermore, a single polarity layer 30 is crystal grown to thickness T3 on the Ga-polar surface 10a, on the selective growth mask 12b, and on the surface 22b of the polarity inversion layer 22.

In this case, because the thickness T1 of the polarity inversion layer 22 is 100 nm or less, the step difference T1 between the surfaces 30a and 30b of the single polarity layer 30 is easily set to 100 nm or less. In this embodiment, the total area of a plurality of distributed small openings 12c is 50% or less of the area of the N-polar surface 10b. Each of the small openings 12c serves as a nucleus for lateral growth on the selective growth mask 12b.

On the other hand, in the first embodiment, which is free from lateral growth, the crystal grain is very small and results in low monocrystallinity due to axis misalignment between grains. Thus, crystal defects are likely to concentrate. Hence, the nitride semiconductor of the first embodiment is preferably used in the case where the area ratio of the N-polar surface is low and the area is small.

Figure 3D:
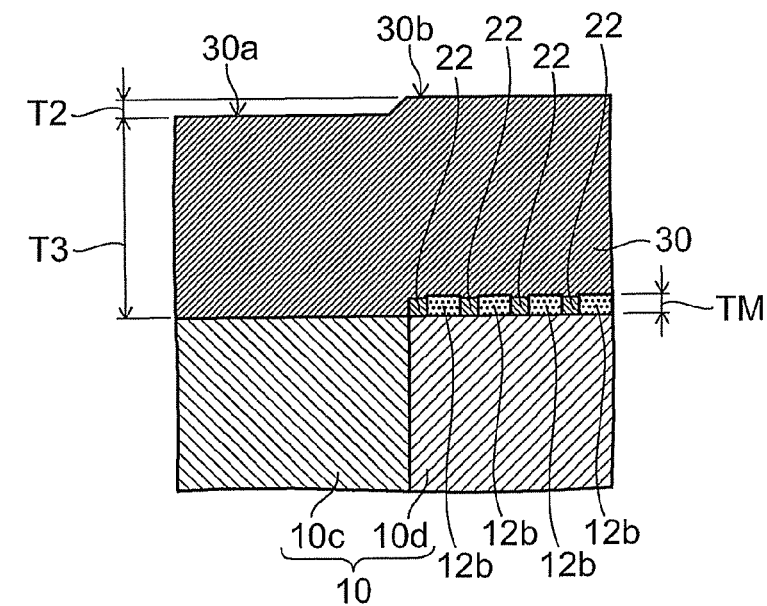

In contrast, in the nitride semiconductor of the second embodiment, which includes lateral growth, crystal defects due to high-concentration Mg doping can be prevented from being inherited to the upper layer. Hence, this nitride semiconductor is preferably used in the case where the area ratio of the N-polar surface 10b is high and the area is large. FIG. 3D is a schematic cross-sectional view of the nitride semiconductor according to the second embodiment after completion of the manufacturing process.

The second embodiment can reduce the step difference at the surface, simplify the manufacturing process, achieve more uniform electrical characteristics in the wafer, and improve the yield. Furthermore, the characteristics and yield of LED according to this embodiment can be generally comparable to the characteristics and yield of LED free from mixed crystal polarity. Thus, this embodiment can reduce the ineffective region of the wafer, hence facilitating device cost reduction.

The material of the selective growth mask used in the present embodiments is not limited to $SiO_2$, but can be an insulating film illustratively made of silicon nitride, or a metal such as tungsten (W), nickel (Ni), and titanium (Ti). Use of a metal is advantageous because a locally selective mask is conveniently formed by corrosion by ammonia at the beginning of the temperature increasing process in the GaN growth.

Typically, the single polarity layer 30 of the wafer of the nitride semiconductor according to the first and second embodiment is formed as a laminated body. In the case of forming an LED, on an n-type substrate 10, an n-type GaN foundation layer (thickness 2 μm), an InGaN-based MQW (multiple quantum well) light emitting layer (total thickness 0.045 μm), a p-type AlGaN cladding layer (thickness 0.5 μm), a p-type contact layer (thickness 0.03 μm) are laminated in this order.

In this case, the single polarity layer 30 has a thickness of approximately 2.575 μm. This is sufficiently thicker than the surface step difference, 100 nm, and can be regarded as generally flat in the device manufacturing process. A current flowing through the MQW layer produces light with an emission wavelength of 390 to 540 nm. Because the crystal polarity can be equalized in the wafer surface, it is possible to achieve generally uniform device characteristics and high device yield.

Alternatively, the light emitting device can be a semiconductor laser. Furthermore, the wafer of the present embodiments can be used to form a power electronic device with high speed or high breakdown voltage, such as HBT (hetero-bipolar transistor).

The embodiments of the invention have been described with reference to the drawings. However, the invention is not limited to these embodiments. The material, size, shape, and layout of the substrate, crystal polarity, crystal layer, and selective growth mask constituting the invention can be modified by those skilled in the art without departing from the spirit of the invention, and such modifications are also encompassed within the scope of the invention.

The invention claimed is:

1. A nitride semiconductor comprising:
   a substrate having a major surface including a first crystal polarity surface and a second crystal polarity surface different from the first crystal polarity surface; and
   a single polarity layer having a single crystal polarity on an upper surface, the single polarity layer being provided above the first crystal polarity surface and the second crystal polarity surface,
   wherein the upper surface of the single polarity layer includes a first surface of the single polarity layer above the second crystal polarity surface, and a step difference between the first surface of the single polarity layer and the second crystal polarity surface is 100 nm or less.

2. The nitride semiconductor according to claim 1, wherein the single polarity layer is made of a laminated body.

3. The nitride semiconductor according to claim 2, wherein the laminated body includes a light emitting layer.

4. The nitride semiconductor according to claim 1, wherein the substrate is made of GaN, the first crystal polarity surface is a Ga surface, and the second crystal polarity surface is a N surface.

5. The nitride semiconductor according to claim 4, wherein the single crystal polarity layer on the upper surface of the single polarity layer is the first crystal polarity surface.

6. The nitride semiconductor according to claim 5, further comprising: a polarity inversion layer interposed between the second crystal polarity surface and the single polarity layer.

7. The nitride semiconductor according to claim 6, wherein the polarity inversion layer has a Mg concentration of $1 \times 10^{20}$ $cm^{-3}$ or more.

8. The nitride semiconductor according to claim 4, further comprising:
   a polarity inversion layer interposed between the second crystal polarity surface and the single polarity layer.

9. The nitride semiconductor according to claim 1, further comprising: a selective growth mask provided between the second crystal polarity surface and the single polarity layer and having an opening.

10. The nitride semiconductor according to claim 9, wherein the selective growth mask has a thickness of 100 nm or less.

11. The nitride semiconductor according to claim 9, wherein the total area of the opening is 50% or less of the area of the second crystal polarity surface.

12. The nitride semiconductor according to claim 1, the upper surface of the single polarity layer is the first crystal polarity surface.

13. The nitride semiconductor according to claim 12, further comprising: a polarity inversion layer interposed between the second crystal polarity surface and the single polarity layer.

14. The nitride semiconductor according to claim 13, wherein the polarity inversion layer has a Mg concentration of $1 \times 10^{20}$ cm$^{-3}$ or more.

15. The nitride semiconductor according to claim 1, further comprising a polarity inversion layer interposed between the second crystal polarity surface and the single polarity layer.

* * * * *